United States Patent
Ito

(10) Patent No.: US 7,977,186 B2
(45) Date of Patent: Jul. 12, 2011

(54) PROVIDING LOCAL BOOSTING CONTROL IMPLANT FOR NON-VOLATILE MEMORY

(75) Inventor: Fumitoshi Ito, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 879 days.

(21) Appl. No.: 11/536,389

(22) Filed: Sep. 28, 2006

(65) Prior Publication Data

US 2008/0081419 A1 Apr. 3, 2008

(51) Int. Cl.
*H01L 21/336* (2006.01)
(52) U.S. Cl. .................................. 438/257; 257/E21.61
(58) Field of Classification Search .......... 438/257–267; 257/314–320, E21.422, E21.69, E27.103, 257/E29.306; 365/185.28
See application file for complete search history.

(56) References Cited

U.S. PATENT DOCUMENTS

| | | | |
|---|---|---|---|
| 4,939,690 A | 7/1990 | Momodomi |
| 5,386,422 A | 1/1995 | Endoh |
| 5,432,106 A | 7/1995 | Hong |
| 5,522,580 A | 6/1996 | Varner, Jr. |
| 5,570,315 A | 10/1996 | Tanaka |
| 5,638,327 A | 6/1997 | Dallabora |
| 5,712,814 A | 1/1998 | Fratin |
| 5,770,502 A | 6/1998 | Lee |
| 5,774,397 A | 6/1998 | Endoh |
| 5,783,457 A | 7/1998 | Hsu |
| 5,837,584 A | 11/1998 | Lu |
| 5,874,329 A | 2/1999 | Neary |
| 5,891,774 A | 4/1999 | Ueda |
| 5,963,808 A | 10/1999 | Lu |
| 6,030,869 A | 2/2000 | Odake |
| 6,046,935 A | 4/2000 | Takeuchi |
| 6,101,128 A | 8/2000 | Yamauchi |
| 6,107,658 A | 8/2000 | Itoh et al. |
| 6,130,134 A | 10/2000 | Chen |
| 6,191,975 B1 | 2/2001 | Shimizu |
| 6,222,762 B1 | 4/2001 | Guterman |
| 6,229,177 B1 | 5/2001 | Yeap |
| 6,265,292 B1 | 7/2001 | Parat |
| 6,300,656 B1 | 10/2001 | Ueno |
| 6,320,236 B1 | 11/2001 | Krivokapic |
| 6,368,914 B1 | 4/2002 | Kim et al. |
| 6,384,457 B2 | 5/2002 | Tyagi |

(Continued)

OTHER PUBLICATIONS

Office Action dated Feb. 7, 2008 in U.S. Appl. No. 11/536,416, filed Sep. 28, 2006.

(Continued)

*Primary Examiner* — Brook Kebede
(74) *Attorney, Agent, or Firm* — Vierra Magen Marcus & DeNiro LLP

(57) ABSTRACT

A substrate of a non-volatile storage system includes selected regions in which additional ions are deeply implanted during the fabrication process. NAND strings are formed over the selected regions such that end word lines of the NAND strings are over the deeply implanted ions. The presence of the deeply implanted ions below the end word lines increases a channel capacitance of the substrate under the end word lines. Due to the increased capacitance, boosting of a channel in the substrate below the end word lines is reduced, thereby reducing the occurrence of gate induced drain leakage (GIDL) and band-to-band tunneling (BTBT) and, consequently, program disturb. A shallow ion implantation may also be made to set a threshold voltage of storage elements of the NAND string.

20 Claims, 15 Drawing Sheets

U.S. PATENT DOCUMENTS

| | | |
|---|---|---|
| 6,456,528 B1 | 9/2002 | Chen |
| 6,495,891 B1 | 12/2002 | Kinoshita |
| 6,504,763 B1 * | 1/2003 | Yang et al. ............... 365/185.28 |
| 6,522,580 B2 | 2/2003 | Chen |
| 6,529,410 B1 | 3/2003 | Han et al. |
| 6,534,787 B1 | 3/2003 | Hsu |
| 6,580,639 B1 | 6/2003 | He |
| 6,620,682 B1 | 9/2003 | Lee |
| 6,632,686 B1 | 10/2003 | Keshavarzi |
| 6,689,658 B2 | 2/2004 | Wu |
| 6,703,659 B2 | 3/2004 | Chan |
| 6,744,668 B1 | 6/2004 | Van Buskirk |
| 6,762,104 B2 | 7/2004 | Suh |
| 6,850,439 B1 | 2/2005 | Tanaka |
| 6,859,397 B2 | 2/2005 | Lutze |
| 6,888,190 B2 | 5/2005 | Yang et al. |
| 7,046,568 B2 | 5/2006 | Cernea |
| 7,099,200 B2 | 8/2006 | Sakui |
| 7,161,833 B2 | 1/2007 | Hemink |
| 7,196,928 B2 | 3/2007 | Chen |
| 2002/0100930 A1 | 8/2002 | Yaegashi |
| 2002/0190306 A1 | 12/2002 | Sasago |
| 2004/0051133 A1 | 3/2004 | Sugita |
| 2004/0057287 A1 | 3/2004 | Cernea |
| 2004/0067616 A1 | 4/2004 | Hachisuka |
| 2004/0109357 A1 | 6/2004 | Cernea |
| 2004/0166634 A1 * | 8/2004 | Lee et al. ...................... 438/262 |
| 2004/0255090 A1 | 12/2004 | Guterman |
| 2005/0024939 A1 | 2/2005 | Chen |
| 2005/0094440 A1 | 5/2005 | Tu et al. |
| 2005/0099847 A1 | 5/2005 | Ichige |
| 2005/0104120 A1 | 5/2005 | Ichige |
| 2005/0167731 A1 | 8/2005 | Lee et al. |
| 2006/0011991 A1 | 1/2006 | Yaegashi |
| 2006/0044872 A1 | 3/2006 | Nazarian |
| 2006/0071264 A1 * | 4/2006 | Hemink et al. ............... 257/315 |
| 2006/0126390 A1 | 6/2006 | Gorobets |
| 2006/0140007 A1 | 6/2006 | Cernea |
| 2006/0158947 A1 | 7/2006 | Chan |
| 2007/0015332 A1 | 1/2007 | Hemink et al. |
| 2007/0047313 A1 | 3/2007 | Hosono |
| 2007/0076494 A1 | 4/2007 | Takeuchi et al. |
| 2007/0081384 A1 | 4/2007 | Hemink |
| 2007/0091682 A1 | 4/2007 | Kang |
| 2007/0127291 A1 | 6/2007 | Fong et al. |
| 2008/0061358 A1 | 3/2008 | Choi |

OTHER PUBLICATIONS

International Search Report and Written Opinion in counterpart PCT/US2007/078815, dated Apr. 28, 2008.

Response to Office Action dated Jul. 20, 2009, U.S. Appl. No. 11/536,416, filed Sep. 28, 2006.

Response to Office Action dated May 6, 2008, U.S. Appl. No. 11/536,416, filed Sep. 28, 2006.

Office Action dated Jun. 29, 2007 for U.S. Appl. No. 11/536,416.

Li, et al., "Effects of Source Resistance and Bit Line Column Leakage on HCI Programming," Technology Solution Organization, Freescale Semiconductor, pp. 57-60.

Yoshikawa, et al., "An Asymmetrical Lightly Doped Source Cell for Virtual Ground High-Density EPROM's," IEEE Transactions on Electron Devices, vol. 17, No. 4, Apr. 1990, pp. 1046-1051.

Office Action dated Sep. 4, 2008, U.S. Appl. No. 11/536,416, filed Sep. 28, 2006.

U.S. Appl. No. 11/536,416, filed Sep. 28, 2006.

Response dated Oct. 29, 2007 to Office Action dated Jun. 29, 2007 in U.S. Appl. No. 11/536,416.

R.F. Pierret, Semiconductor Device Fundamentals, Addison-Wesley, 1996, p. 214 and 587.

Response to Office Action dated Nov. 3, 2008, U.S. Appl. No. 11/536,416, filed Sep. 28, 2006.

Office Action dated Nov. 18, 2008, U.S. Appl. No. 11/536,416, filed Sep. 28, 2006.

Notice of Allowance dated Nov. 30, 2009, U.S. Appl. No. 11/536,416, filed Sep. 28, 2006.

Office Action dated Apr. 29, 2009, U.S. Appl. No. 11/536,416, filed Sep. 28, 2006.

Response to Final Office Action dated Feb. 17, 2009 in U.S. Appl. No. 11/536,416.

Office Action date Apr. 12, 2011, Taiwan Patent Application No. 096135788.

* cited by examiner

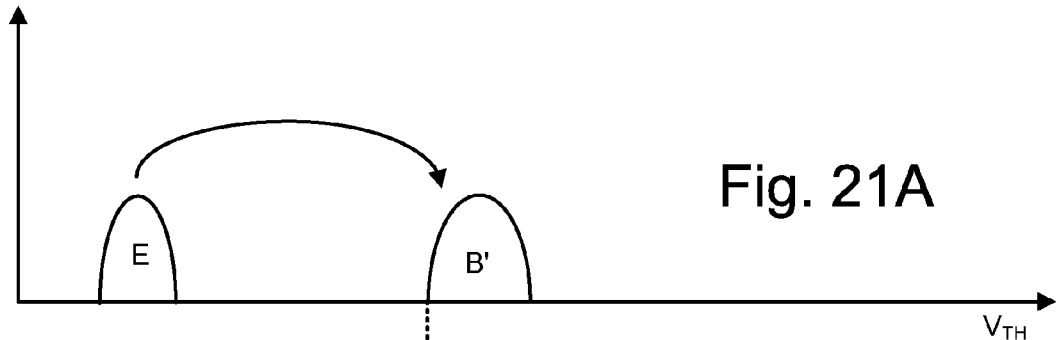
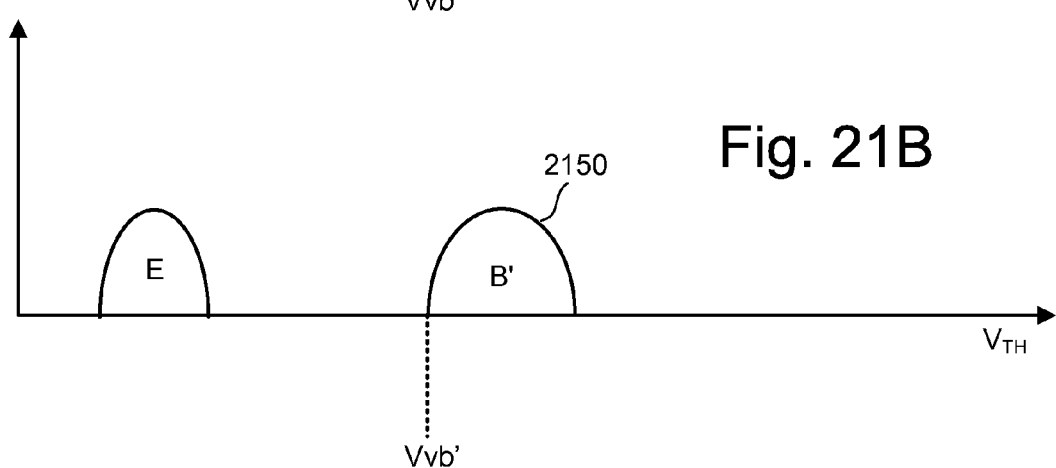
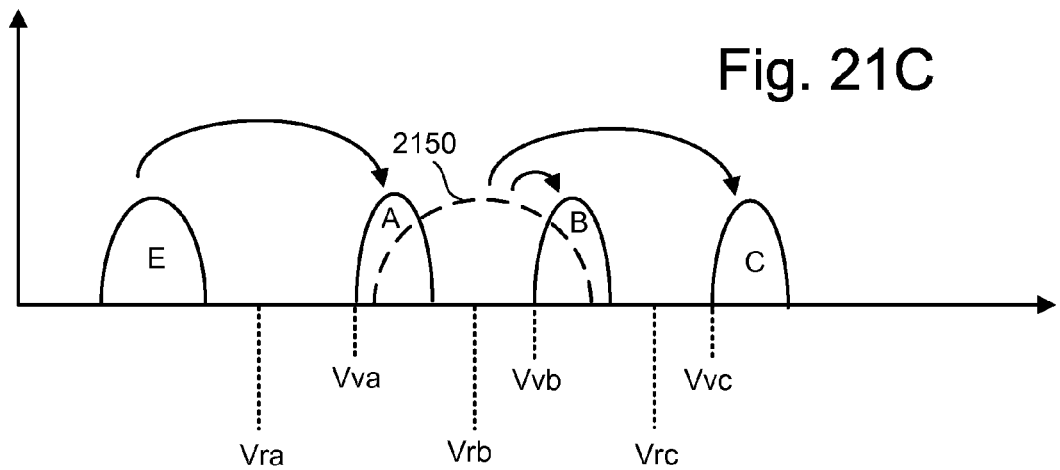

PROVIDING LOCAL BOOSTING CONTROL IMPLANT FOR NON-VOLATILE MEMORY

CROSS-REFERENCE TO RELATED APPLICATIONS

This application is related to, commonly assigned U.S. patent application Ser. No. 11/536,416, filed Sep. 28, 2006, published as US2008/0079052 on Apr. 3, 2008, issued as U.S. Pat. No. 7,705,387 on Apr. 27, 2010, titled "Non-Volatile Memory With Local Boosting Control Implant", and incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

However, various forms of program disturb have been experienced during programming due to the proximity of the non-volatile storage elements to one another. Moreover, this problem is expected to worsen with further scaling of NAND technology. Program disturb occurs when the threshold voltage of a previously-programmed non-volatile storage element is shifted due to subsequent programming of other non-volatile storage elements. Boosting techniques attempt to address this problem by boosting a channel area of a NAND string that is inhibited from programming to a high potential while connecting the channel area of a NAND string that contains a storage element to be programmed to a low potential such as 0 V. For example, the erased area self boosting (EASB) technique isolates the boosted channels by applying a sufficiently low voltage, typically 0 V, on one unselected word line of the NAND string, in between the programmed and erased areas, while applying a high pass voltage such as 8 V on the other unselected word lines. Revised EASB (REASB) is similar to EASB but applies a small voltage such as 2.5 V to an adjacent isolation word line. However, as dimensions scale down, program disturb remains a serious problem even with boosting because a high electric field caused by the boosting induces band-to-band tunneling and/or gate-induced drain leakage (GIDL).

SUMMARY OF THE INVENTION

The present invention addresses the above and other issues by providing a non-volatile storage system and method which reduces program disturb.

In one embodiment, a non-volatile storage system includes a substrate and at least one NAND string formed, at least in part, over the substrate. The substrate has a shallow implantation of ions implanted therein along a length of the at least one NAND string, and at least a first interval in the substrate along the length of the at least one NAND string has a deep implantation of ions which are implanted deeper in the substrate than the shallow implantation of ions. For example, at least a portion of the first interval may be adjacent to a select gate of the at least one NAND string. Additionally, a second interval in the substrate along the length of the at least one NAND string can have a deep implantation of ions. In this case, the first and second intervals can be adjacent to first and second select gates, respectively, of the at least one NAND string. The substrate can have a p-type region in which the ions are implanted. The deep ion implant provides reduced channel boosting in the substrate, e.g., due to a higher channel capacitance, and may be provided near the select gates where a reduction in boosting is especially needed to prevent gate induced drain leakage (GIDL) and band-to-band tunneling (BTBT).

In another aspect, a non-volatile storage system includes at least one NAND string formed, at least in part, over a substrate. The at least one NAND string is in communication with a number of word lines which extend between first and second select gates of the at least one NAND string. Further, a first portion of the substrate has a locally elevated level of implanted ions, and at least one word line extends over the first portion while at least one other word line does not extend over the first portion.

In another aspect, a non-volatile storage system includes a substrate, and a first portion of the substrate has a locally elevated level of implanted ions. Additionally, a set of storage elements is formed, at least in part, over the substrate, such that a first subset of the storage elements is formed, at least in part, over the first portion, while other storage elements in the set are not formed over the first portion.

In another aspect, a method for reducing program disturb in a non-volatile storage system includes implanting a shallow implantation of ions along a length of an area of a substrate and implanting additional ions in the substrate in at least a first interval along the length of the area of the substrate, where the additional ions are implanted deeper in the substrate than the shallow implantation of ions. The method further includes forming at least one NAND string, at least in part, over the area of the substrate, such that a first portion of the at least one NAND string is formed over the first interval. In this manner, a locally elevated level of ions is provided in the first interval. For example, at least a portion of the first interval may be adjacent to a select gate of the at least one NAND string.

In another aspect, a method for reducing program disturb in a non-volatile storage system includes implanting a locally elevated level of ions in a first portion of a substrate and forming at least one NAND string, at least in part, over the substrate. The at least one NAND string is in communication with a number of word lines which extend between first and second select gates of the at least one NAND string. Additionally, at least one word line extends over the first portion while at least one other word line does not extend over the first portion.

In another aspect, a method for reducing program disturb in a non-volatile storage system includes implanting a locally elevated level of ions in a first portion of a substrate and forming a set of storage elements, at least in part, over the substrate. A first subset of the storage elements is formed, at least in part, over the first portion. The method further includes forming other storage elements in the set, at least in part, over a portion of the substrate which does not include the first portion.

BRIEF DESCRIPTION OF THE DRAWINGS

FIG. 6 depicts implanting a shallow implantation of ions in a substrate.
FIG. 7 depicts forming photo resist structures on a substrate.
FIG. 8 depicts a deep ion implantation in selected areas of a substrate.
FIG. 9 depicts a top view of the substrate of FIG. 8 showing regions with deep ion implants.
FIG. 10 depicts a cross-sectional view of the substrate of FIG. 8 showing regions with deep ion implants and NAND strings formed on the substrate.
FIG. 11 depicts a top view of a substrate showing regions with deep ion implants.
FIG. 12 depicts a cross-sectional view of the substrate of FIG. 11 showing regions with deep ion implants and NAND strings formed on the substrate.
FIG. 13 depicts a flowchart of a process for implanting additional ions in a substrate to control boosting.
FIGS. 21A-C show various threshold voltage distributions and describe a process for programming non-volatile memory.

DETAILED DESCRIPTION

The present invention provides a non-volatile storage system and method which reduces program disturb. In one approach, a deep ion implant is provided in a substrate near end word lines of NAND strings to selectively control boosting in the substrate in a vicinity of the end word lines.

Figure 1:
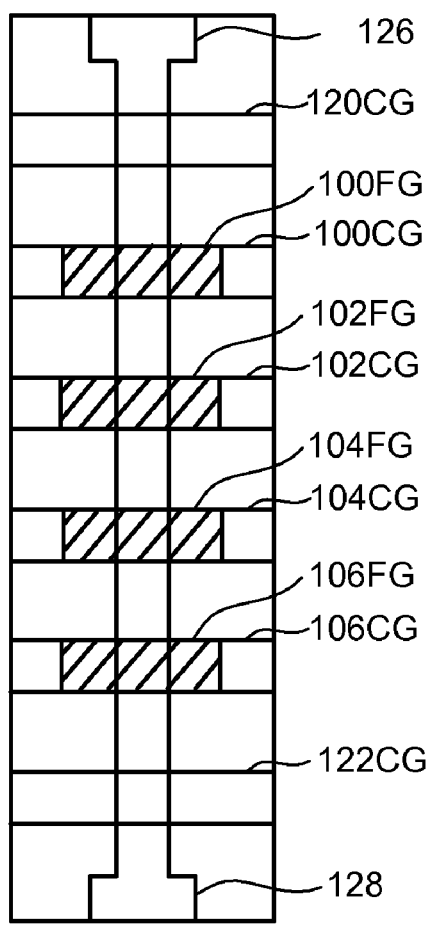
FIG. 1 is a top view of a NAND string.
Figure 2:
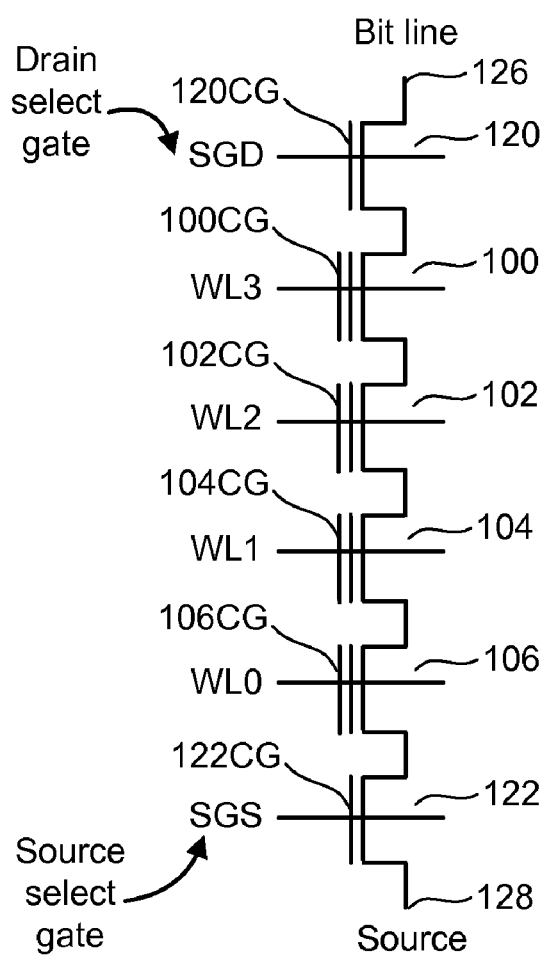
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate.

Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
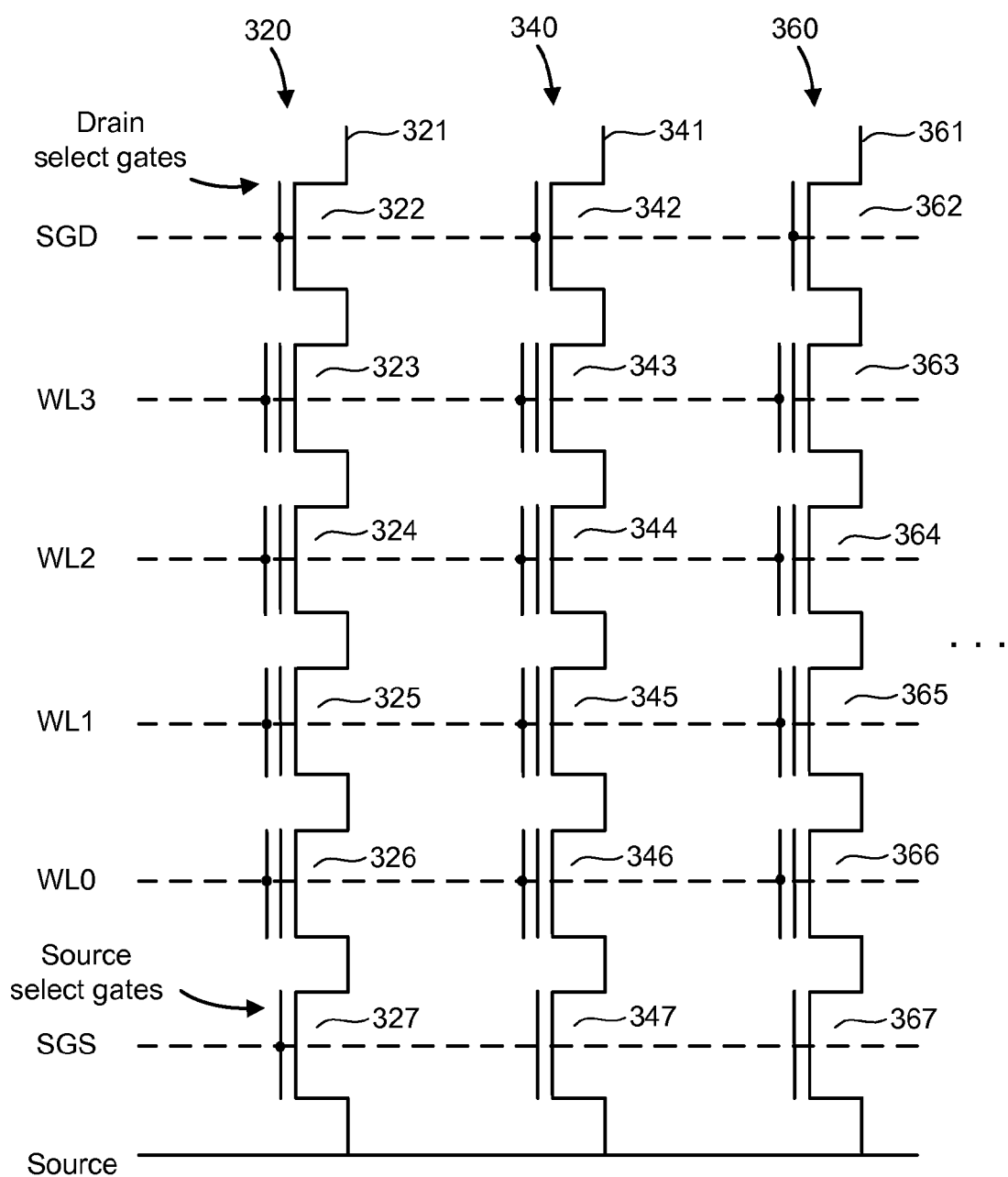
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522, 580, 5,570,315, 5,774,397, 6,046,935, 6,456,528 and 6,522, 580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. For example, if NAND string 320 is inhibited and NAND string 340 is being programmed, program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by GIDL or other leakage mechanisms, resulting in the same problem. Other effects, such as shifts in the charge stored in a programmed storage element due to capacitive coupling between storage elements, can also be problematic.

Figure 4:
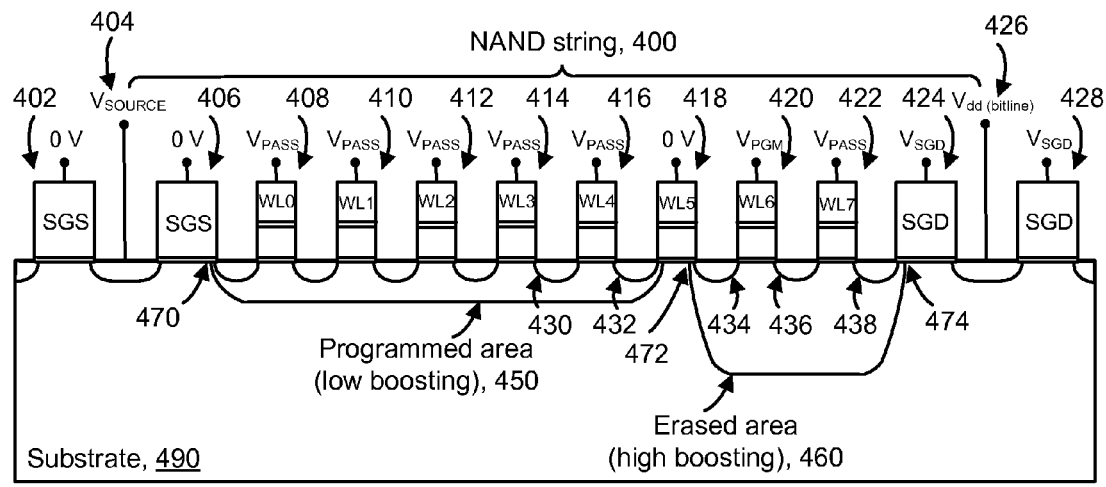
FIG. 4 depicts a cross-sectional view of a NAND string showing programmed and erased areas.

FIG. 4 depicts a cross-sectional view of a NAND string showing programmed and erased areas. The view is simplified and not to scale. Boosting techniques attempt to reduce the incidence of program disturb by boosting a channel area of a NAND string that is inhibited from programming to a high potential while connecting the channel area of a NAND string that contains a storage element to be programmed to a low potential such as 0 V. For example, the erased area self boosting (EASB) technique isolates the boosted channels by applying a sufficiently low voltage, typically 0 V, on one unselected word line of the NAND string, in between the programmed and erased areas, while applying a high pass voltage such as 8 V on the other unselected word lines. Revised EASB (REASB) is similar to EASB but applies a small voltage such as 2.5 V to an adjacent isolation word line. However, as dimensions scale down, program disturb remains a serious problem even with boosting because a high electric field caused by the boosting induces band-to-band tunneling and/or gate-induced drain leakage (GIDL).

The NAND string 400 includes a source-side select gate 406, a drain-side select gate 424, and eight storage elements 408, 410, 412, 414, 416, 418, 420 and 422, all of which are formed, at least partly, on a substrate 490, which can include an insulating layer. Another source-side select gate 402 is provided for another NAND string on the left-hand side of NAND string 400, while another drain-side select gate 428 is provided for another NAND string on the right-hand side of NAND string 400. In one embodiment, the NAND strings on the right-and left-hand sides of NAND string 400 include storage elements that are programmed at the same time as a storage element on NAND string 400. A source supply line 404 with a potential of $V_{SOURCE}$ is provided between the select gates 402 and 406, while a bit line 426 with a potential of Vdd (bit line) is provided between the select gates 424 and 428. During programming, a programming voltage $V_{PGM}$ is provided on a selected word line, e.g., a word line associated with one or more storage elements to be programmed, in this case storage element 420. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. In the example provided, the NAND string 400 is programmed using EASB, in which case 0 V is applied to the source-side word line of the selected word line, namely, WL5 (referred to as an isolation word line) which is associated with storage element 418 (referred to as an isolation storage element). A pass voltage, $V_{PASS}$, is applied to the remaining word lines associated with NAND string 400. A voltage $V_{SGS}$=0 V is applied to the select gates 402 and 406 to keep them closed, and a voltage, $V_{SGD}$, such as 2.5 V is applied to the select gates 424 and 428 to keep them open.

Assuming programming of storage elements along the NAND string progresses from storage element 408 to storage element 422, when storage element 420 is being programmed, storage elements 408-418 will already have been programmed, and storage element 422 will not yet have been programmed. Thus, all or some of storage elements 408-418 will have electrons programmed into and stored in their respective floating gates, and storage element 422 can be erased or partially programmed, depending on the programming mode. For example, the storage element may have been previously programmed in the first step of a two-step programming technique. When the NAND string 400 is currently an inhibited NAND string, due to the application of $V_{PGM}$ on the word line associated with storage element 420, WL6, and $V_{PASS}$ on other word lines, a potential of a channel of the substrate 490 will be boosted. In particular, an area of the channel associated with the one or more still-erased storage elements, e.g., erased area 460, will experience relatively higher boosting than programmed area 450 because storage elements in the erased area 460 are still erased, in one programming scenario. Moreover, this highly-boosted area will be bounded by the isolation storage element, e.g., storage element 418, and by the drain-side select gate 424.

With EASB, a sufficiently low voltage is applied to the source-side neighbor of the selected word line to isolate the programmed and erased channel areas in the substrate. This technique is successful in boosting the erased channel area effectively. However, a highly boosted channel with a small capacitance increases the electric field at the junction edge 472 of the storage element associated 418 with the isolation word line WL5. Moreover, this phenomenon is stronger when the isolation word line is closer to the drain side select gate than the source side select gate. As a result, GIDL and BTBT can occur at the junction 472, as detailed further below in connection with FIG. 5. GIDL and BTBT can also occur at other locations, such as the edge 474 of the drain side select gate 424 which is at the other end of the highly boosted erased area 460. Further, when programming word lines near the source side select gate such as WL0 with LM data on WL1 especially, GIDL and BTBT can occur at the edge 470 of the source side select gate. A storage element with LM data has undergone the first step of a two-step programming process (see, e.g., threshold voltage distribution 2150, FIG. 21B). LM refers to a lower-middle threshold voltage. GIDL and BTBT can occur with other boosting modes as well.

Figure 5:
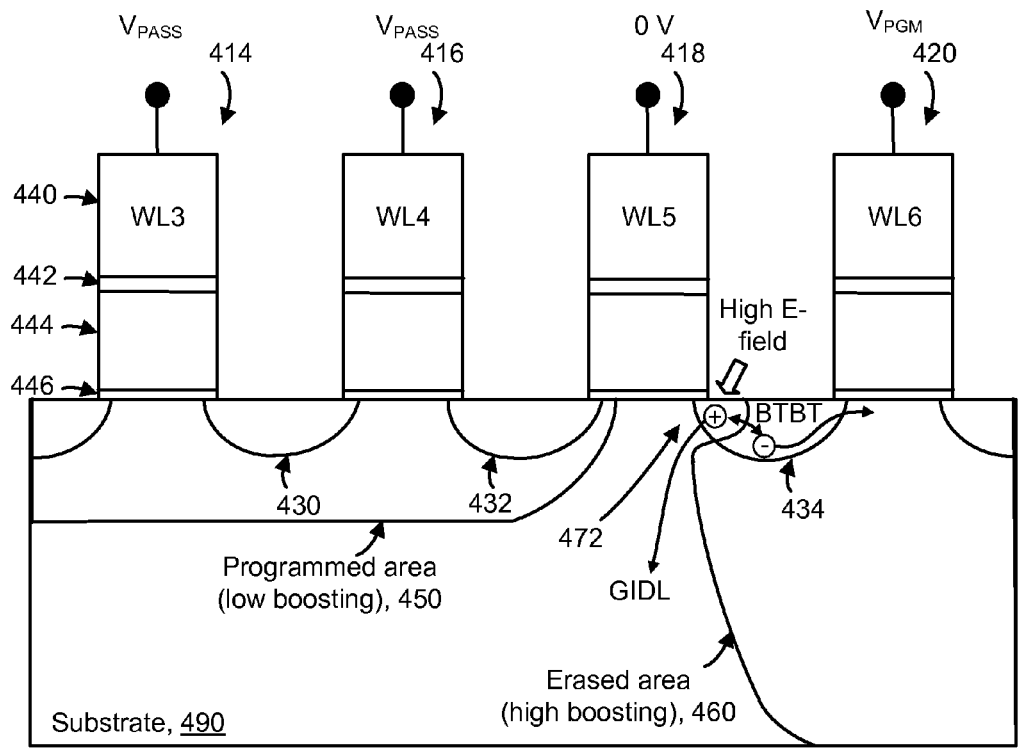
FIG. 5 depicts an occurrence of gate-induced drain leakage (GIDL) and band-to-band-tunneling (BTBT) in a NAND string channel near an isolation word line.

FIG. 5 depicts an occurrence of GIDL and band-to-band-tunneling (BTBT) in a NAND string channel near an isolation word line. A portion of the NAND string 400 and substrate 490 of FIG. 4 is shown in greater detail, including storage elements 414, 416, 418 and 420, programmed area 450 and erased area 460. Additionally, details of the storage element 414 include a control gate 440, dielectric 442, floating gate 444 and insulator 446. WL3, WL4, WL5 and WL6 extend via the control gates of storage elements 414, 416, 418 and 420, respectively. Source/drain regions are provided between the storage elements and select gates, including source/drain regions 430, 432 and 434. One example of GIDL and BTBT, which can occur during boosting modes such as EASB and lead to program disturb, is indicated. When the boosted channel potential is high, a high electric field (E-field) at the isolation storage element 418, which has 0 V applied to its control gate, causes GIDL and BTBT at junction 472. In particular, electron-hole pairs are generated as indicated by the example electron, designated by a small circle with a "−" sign, and hole, designated by a small circle with a "+" sign. Some of the generated hot electrons are accelerated, then injected into the floating gate of storage element 420 by a high vertical field caused by $V_{PGM}$.

Moreover, high electric field induced program disturb can be worse when programming storage elements via higher word lines, which are close to the drain side select gate, and via lower word lines, which are closer to the source side select gate, than when programming storage elements located between the two extremes. At the higher word lines, since boosting efficiency greatly improves due to small channel capacitance and boosting is dominantly controlled by program voltage ($V_{PGM}$), high boosting potential under the isolation storage element causes GIDL induced hot carrier injection to the neighbor word line. At the lower word lines, the same situation occurs under the source side select gate, which is biased to 0 V typically during programming. For example, when storage element 410, which is associated with WL1, is partially programmed after a first step of a two-pass programming process (see, e.g., FIG. 21B), WL0 is isolated from the upper channel region since WL1 is close to being cut off. Therefore, the channel region associated with WL0 is highly boosted by $V_{PGM}$.

FIGS. 6-13 relate to a process for implanting additional ions in a substrate to control boosting. One aspect of the invention involves implanting additional ions deeply into selected areas of a substrate which will be close to the select gates of NAND strings when the NAND strings are subsequently formed on the substrate. This additional ion implant controls boosting of higher and/or lower word lines, in particular, by alleviating high boosting at certain areas in which the additional ions are implanted. In particular, after an initial shallow ion implant for controlling the threshold voltage of the storage elements, only selected areas of the substrate, close to where the select gates will be formed, are exposed by a lithography process. Then, additional ions are deeply implanted into the substrate, e.g., deeper than the shallow implant for threshold voltage control, to increase the channel capacitance of the substrate under the higher and lower word lines during boosting. Further, the ions diffuse laterally by a subsequent thermal process such as annealing which is not a self-aligned process. When a NAND string is formed on the substrate, several end word lines which are close to the end of the NAND string, e.g., adjacent to the source side and drain side select gates, are located over the regions which have a locally elevated ion level. Thus, in one embodiment, the technique provides reduced boosting only to the higher and lower word lines without affecting other word lines.

Figure 6:
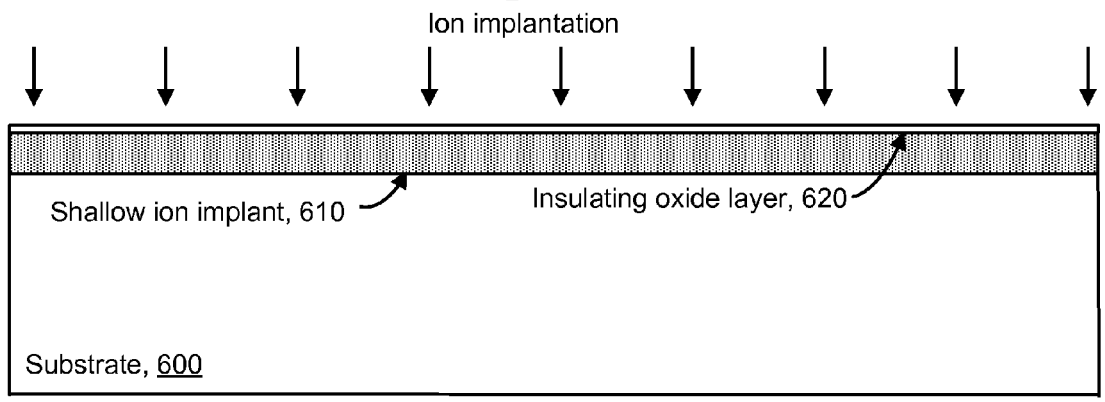
FIGS. 6-13 relate to a process for implanting additional ions in a substrate to control boosting.

FIG. 6 depicts implanting a shallow implantation of ions in a substrate. A shallow ion implant 610 is provided in a substrate 600, which may be p-type, for instance. The ion implantation may include Boron or Indium ions, for example. Generally, acceptor type impurities are effective for suppressing boosting. The proposed implantation process is part of the p-well formation, in one approach, in which case acceptor type impurities are used for the p-well. Phosphorus or Arsenic may also be co-implanted deeper than the p-well implant for making a deep n-well (not shown in the figure). The implant may be made through an insulating oxide layer 620 such as $SiO_2$ which is formed on the substrate 600, in one approach. Alternatively, the implant may be made before the insulating oxide layer 620 is provided. The shallow ion implant is used to control a threshold voltage of the storage elements.

Figure 7:
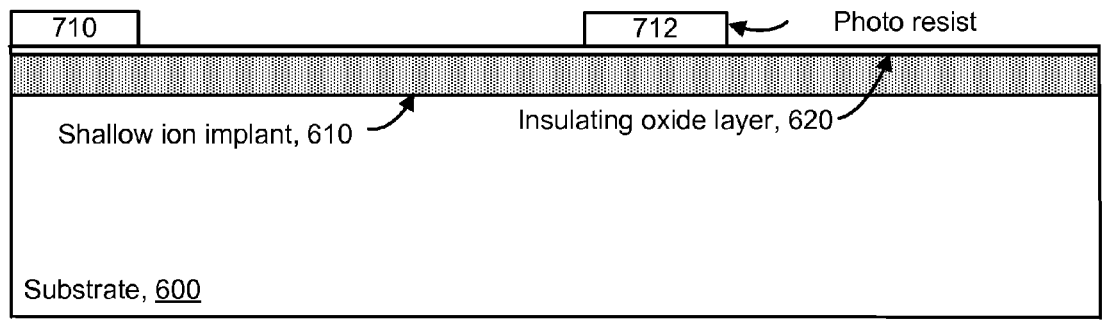
Figure 8:
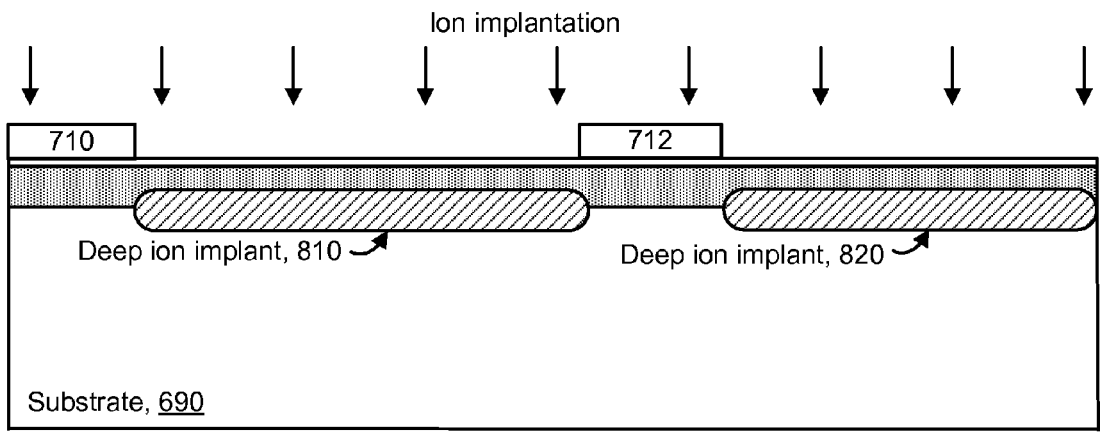

FIG. 7 depicts forming photo resist structures on a substrate. Photolithography can be used to form example photo resist structures 710 and 712, in one possible approach. For example, a coat of resist can be provided over an area of the substrate, then a selected area which will be implanted with a deep ion implant is exposed to light through a mask using a photo lithography tool. The resist is then developed to remove the exposed area and a deep ion implantation process is performed to provide deep ion implants 810, 820 in the substrate 690 (FIG. 8). FIG. 8 depicts a deep ion implantation in selected areas of a substrate. The additional ion implants may be provided using approximately 80-150 keV with a Boron implant and a storage element height of approximately 150-300 nm. Note that the implant energy can vary with storage element height, and should represent a compromise between an energy which is high enough to avoid affecting the threshold voltage of the storage elements, but low enough to affect boosting. That is, the ions should be implanted to a depth which is deep enough to avoid affecting the threshold voltage of the storage elements, but shallow enough to affect boosting. An optimal energy/depth can be determined by experimentation for a particular memory device. In one embodiment, the additional ions which provide locally elevated levels of implanted ions are implanted deeper in the substrate than the shallow ion implant which is used to control a threshold voltage of the storage elements. The threshold voltage is defined at relatively low bias conditions such as during a read/verify operation, so the additional ion implant should not affect this. On the other hand, a high voltage operation such as boosting can be affected by the deep ion implant because the high voltage makes the depletion layer extend deeper into the substrate.

The photo resist structures 710 and 712 are subsequently removed, and other conventional processes are performed including annealing of the substrate 690 and formation of storage elements on the substrate. For example, the storage elements may be provided in a number of NAND strings which are in communication with word lines which extend across the NAND strings. During p-well formation, only one additional mask step and ion implantation is needed.

Figure 9:
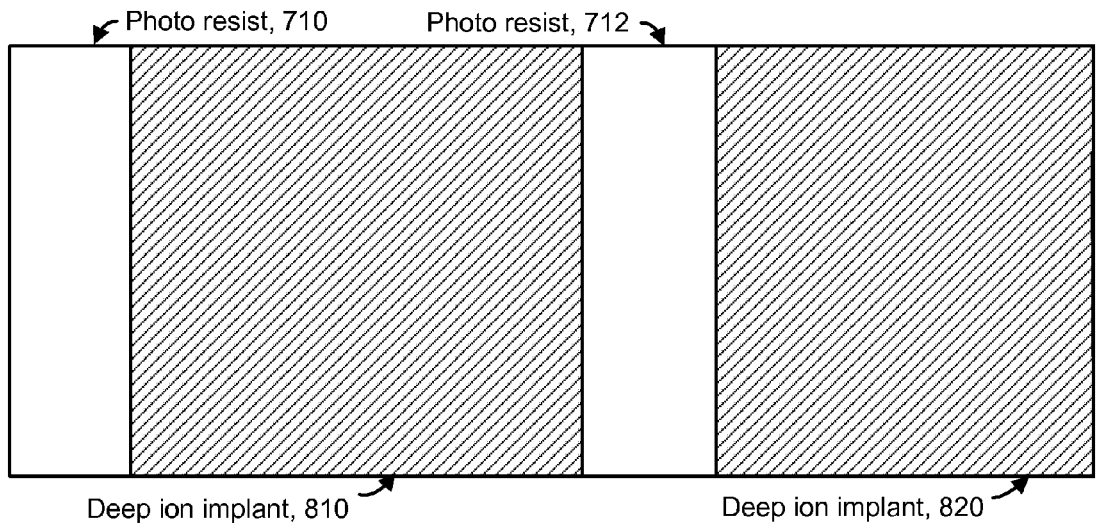

FIG. 9 depicts a top view of the substrate of FIG. 8 showing regions with deep ion implants. The photo resist structures 710 and 712 can extend across the substrate in a word line direction, in which case the deep ion implants 810 and 820 also extend in intervals in the word line direction, along a length of an area of the substrate, in one possible approach.

Figure 10:
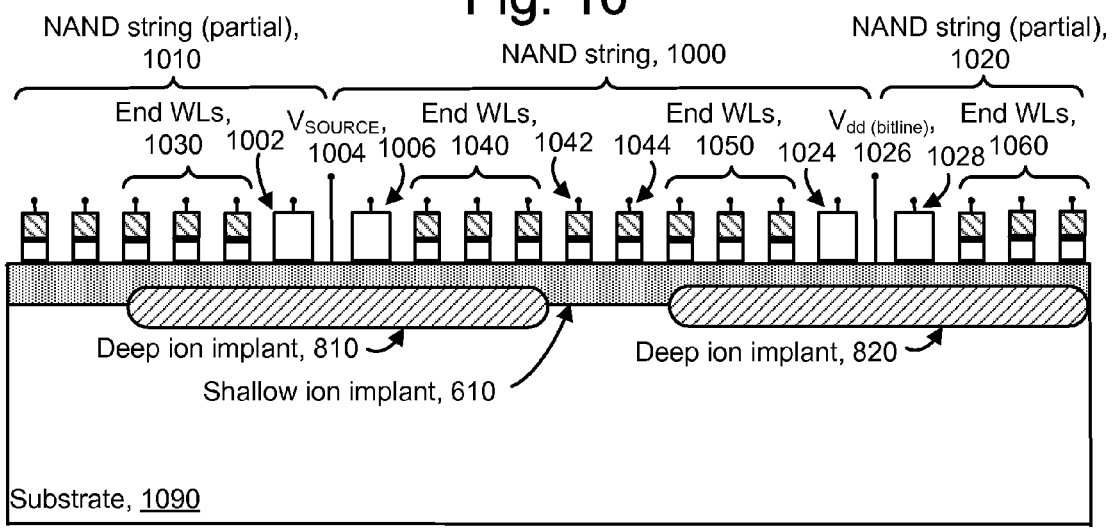

FIG. 10 depicts a cross-sectional view of the substrate of FIG. 8 showing regions with deep ion implants and NAND strings formed on the substrate. An example NAND string 1000 is provided along with a partial view of NAND strings 1010 and 1020. In practice, a number of NAND strings can extend in a bit line direction (shown) and in a word line direction. Also, the example provides an eight-storage element NAND string. In practice, additional storage elements can be provided in a NAND string. The NAND strings are formed so that a number of end word lines are located over the deep ion implants. In this example, the control gate of a storage element may be provided as a portion of the word line (see also FIG. 4). The control gates/word lines are indicated by the cross-hatched regions of the storage elements in FIG. 10.

The substrate has ions implanted along the lengths of the NAND strings, due to the shallow implant, in addition to one or more intervals along the length of a NAND string having deep implanted ions to provide a locally elevated level of implanted ions. Further, at least a portion of the one or more intervals with the deep implanted ions is adjacent to a select gate of a NAND string. Moreover, a number of word lines extend across the NAND strings, so that an interval with deep implanted ions extends under at least one of the word lines which is adjacent to a select gate of a NAND string.

For example, end word lines 1030 from NAND string 1010 and end word lines 1040 from NAND string 1000 are formed over deep ion implant 810. Similarly, end word lines 1050 from NAND string 1000 and end word lines 1060 from NAND string 1020 are formed over deep ion implant 820. The end word lines 1040 may include WL0, WL1 and WL2 (see also FIG. 4) while the end word lines 1050 may include WL5, WL6 and WL7. In contrast, storage elements 1042 and 1044 and the associated word lines in NAND string 1000, for instance, are not formed over deep ion implants. Thus, separated first and second intervals in the substrate (provided by deep ion implants 810 and 820, respectively) extend under end word lines 1040 and 1050, respectively, which are adjacent to the source-side select gate 1006 and the drain-side select gate 1024, respectively, of the NAND string 1000. The first and second intervals in the substrate also extend under subsets of storage elements of the NAND string 1000 which are associated with the end word lines 1040 and 1050, respectively. Additionally, select gates 1002 and 1006, and source supply terminal 1004, extend over deep ion implant 810, while select gates 1024 and 1028, and bit line terminal 1026, extend over deep ion implant 820. This approach facilitates fabrication of the memory device although it is not necessary for the select gates to extend over the deep ion implants. If fabrication techniques permit a more targeted ion implantation, deep ion implantations solely under the end word lines is sufficient.

In this example, a set of three end word lines and the corresponding storage elements are formed over areas of the substrate which have a locally elevated level of ions. As a result, the channel capacitance of the substrate below the end word lines and the corresponding storage elements will be increased and boosting will be reduced in other areas of the substrate below word lines or storage elements which are not formed over a deep ion implant, thereby alleviating program disturb due to GIDL and BTBT, as discussed. The channel capacitance refers to a capacitance between the channel of the substrate and the substrate at large. The number of end word lines which are formed over a deep ion implant can be one or more and can be optimized for a specific memory device based, e.g., on experimentation. Further the number of source-side end word lines which are formed over a deep ion implant can differ from the number of drain-side end word lines which are formed over a deep ion implant. Another variation is for only the source-side or drain-side end word lines to be formed over a deep ion implant.

Figure 11:
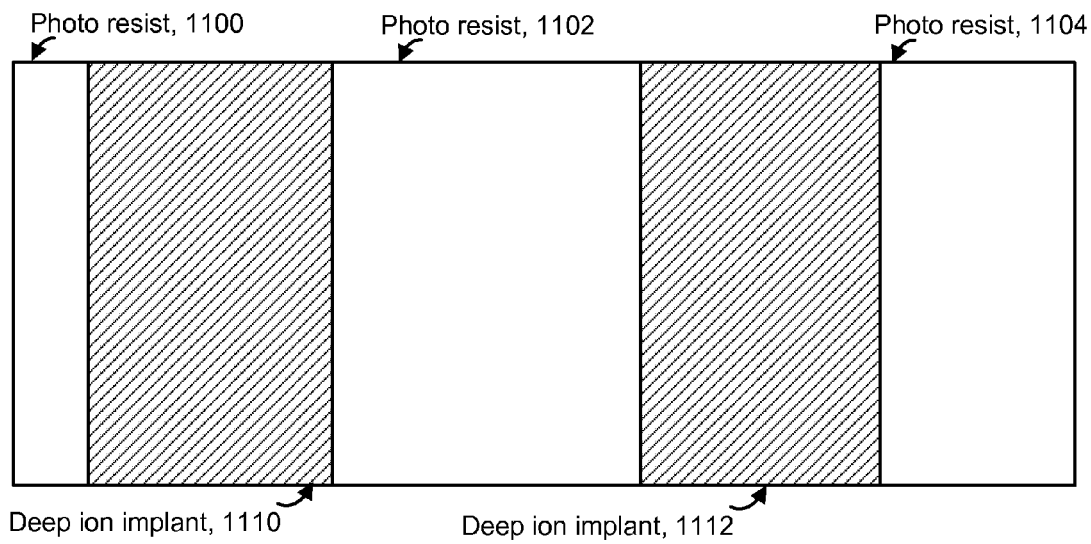

FIG. 11 depicts a top view of a substrate showing regions with deep ion implants. In this example, photo resist structures 1100, 1102 and 1104 are provided, and deep ion implants 1110 and 1112 extend in a word line direction between the photo resist structures.

Figure 12:
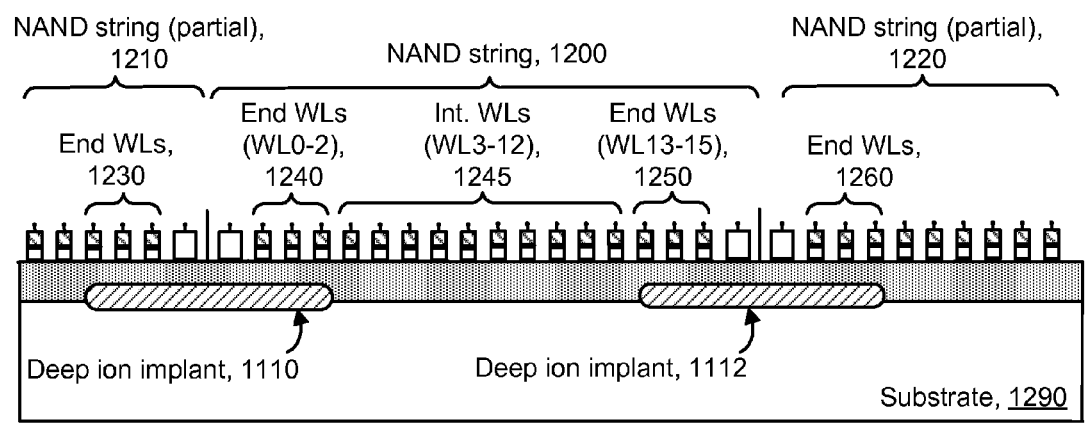

FIG. 12 depicts a cross-sectional view of the substrate of FIG. 11 showing regions with deep ion implants and NAND strings formed on the substrate. The substrate 1290 includes deep ion implants 1110 and 1112. An example NAND string 1200 is provided along with a partial view of NAND strings 1210 and 1220. The example provides sixteen-storage element NAND strings. The NAND strings are formed so that a number of end word lines are located over the deep ion implants. For example, end word lines 1230 from NAND string 1210 and end word lines 1240 from NAND string 1200 are formed over deep ion implant 1110. Similarly, end word lines 1250 from NAND string 1200 and end word lines 1260 from NAND string 1220 are formed over deep ion implant 1112. In contrast, a group 1245 of intermediate word lines and storage elements, between end word lines 1240 and 1250, are not formed over the deep ion implants. For instance, in NAND string 1200, the end word lines 1240 may include WL0, WL1 and WL2 and the end word lines 1250 may include WL13, WL14 and WL15. The group of intermediate word lines 1245 may include WL3-WL12. The control gates/word lines are indicated by the cross-hatched regions of the storage elements.

Figure 13:
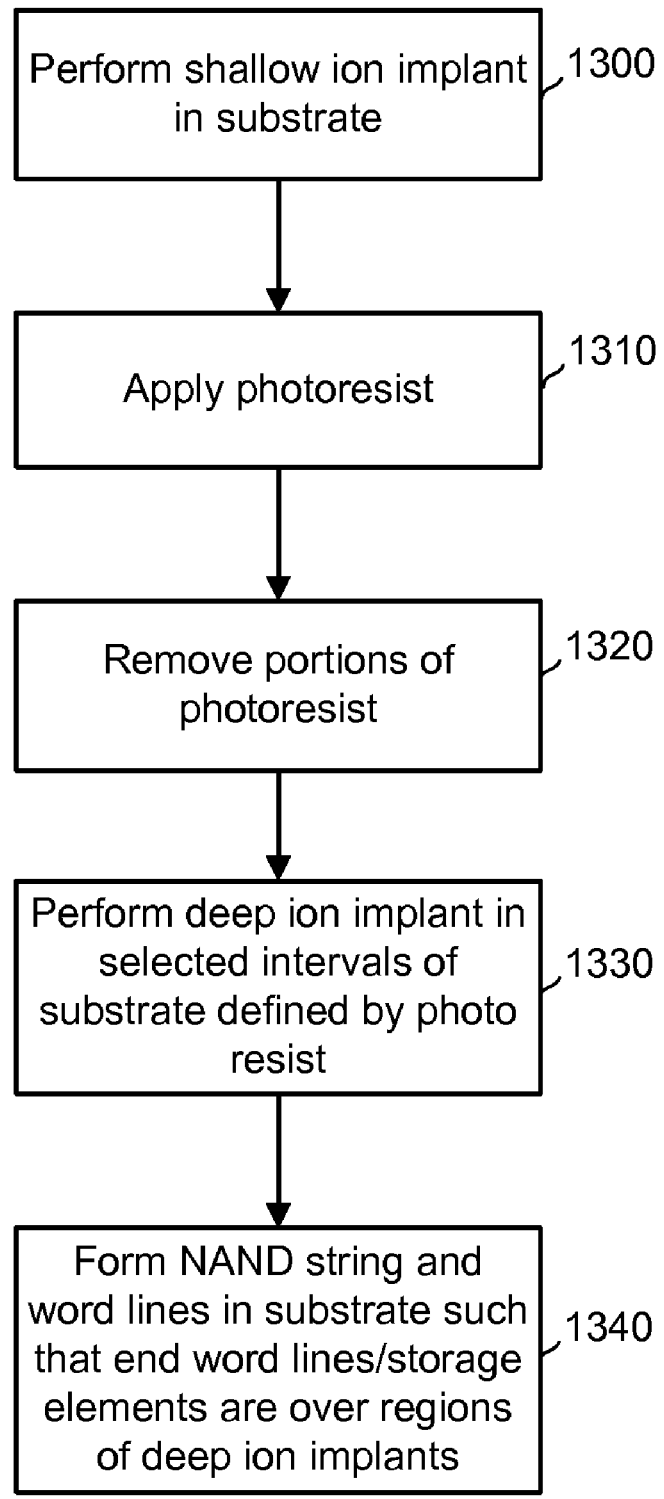

FIG. 13 depicts a flowchart of a process for implanting additional ions in a substrate to control boosting. Referring also to FIGS. 6-12, a shallow ion implant is performed in the substrate (FIG. 6) at step 1300. At step 1310, photo resist is applied to the substrate. At step 1320, portions of the photo resist are removed, leaving the structures of FIG. 7, for example. For instance, portions of the photo resist can be exposed to UV light wherever the photo resist material is to be removed so that the exposed portions become more soluble in a developer. Note that this is an example of one lithographic process which may be used to selectively implant ions into a substrate. Other approaches are possible as well. At step 1330, a deep ion implant is performed in selected intervals of the substrate as defined by openings between the photo resists structures (FIG. 8). At step 1340, NAND strings and word lines are formed on the substrate such that end word lines and storage elements of the NAND strings are over the regions of deep ion implants. It is alternatively possible to provide a deep ion implant after the NAND strings and word lines are formed. Also, it is alternatively possible to provide the shallow ion implant after the deep ion implant or to provide both concurrently or in one continuous process.

Figure 14:
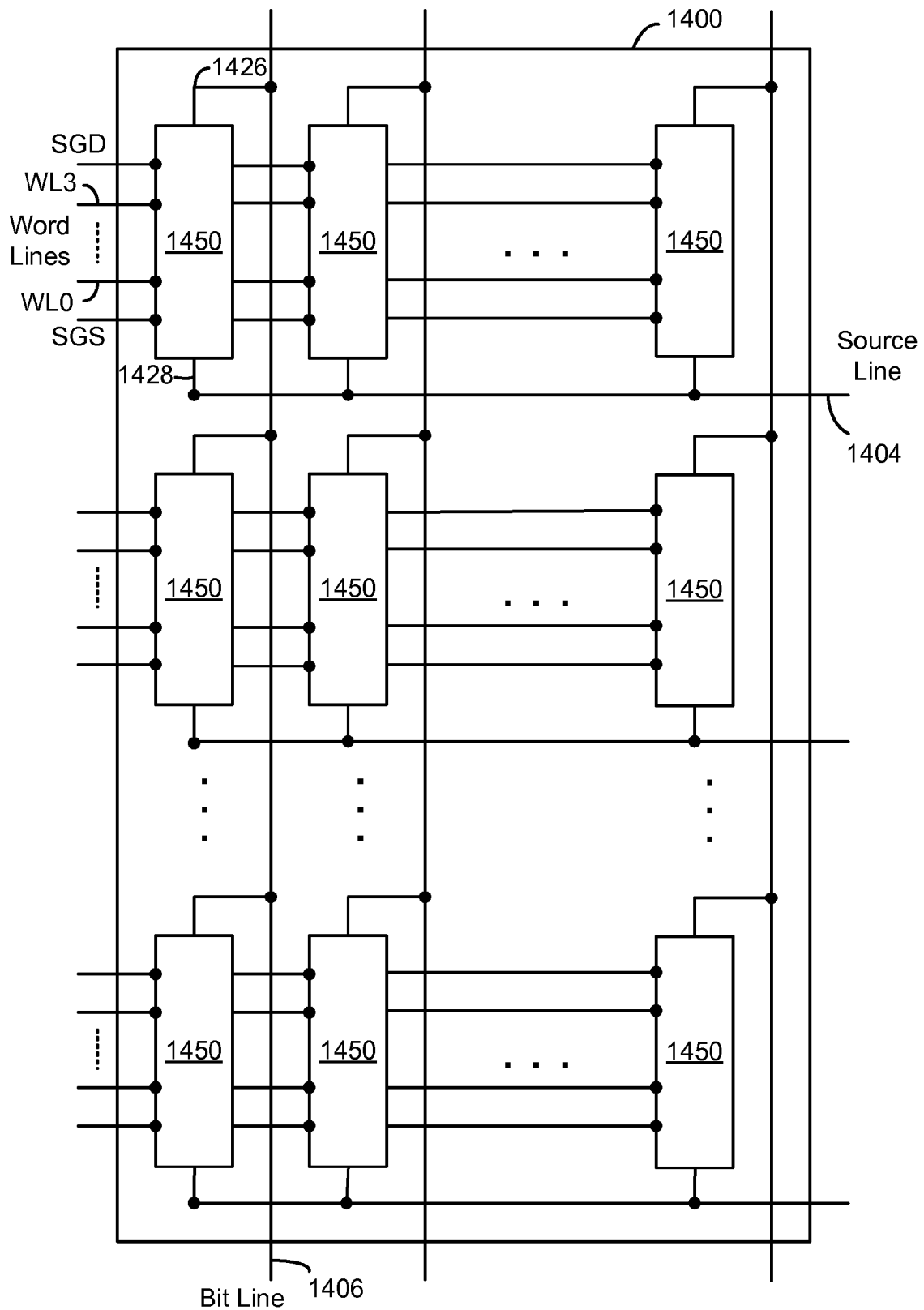
FIG. 14 is a block diagram of an array of NAND flash storage elements.

FIG. 14 illustrates an example of an array 1400 of NAND storage elements, such as those shown in FIGS. 1 and 2. Along each column, a bit line 1406 is coupled to the drain terminal 1426 of the drain select gate for the NAND string 1450. Along each row of NAND strings, a source line 1404 may connect all the source terminals 1428 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 15:
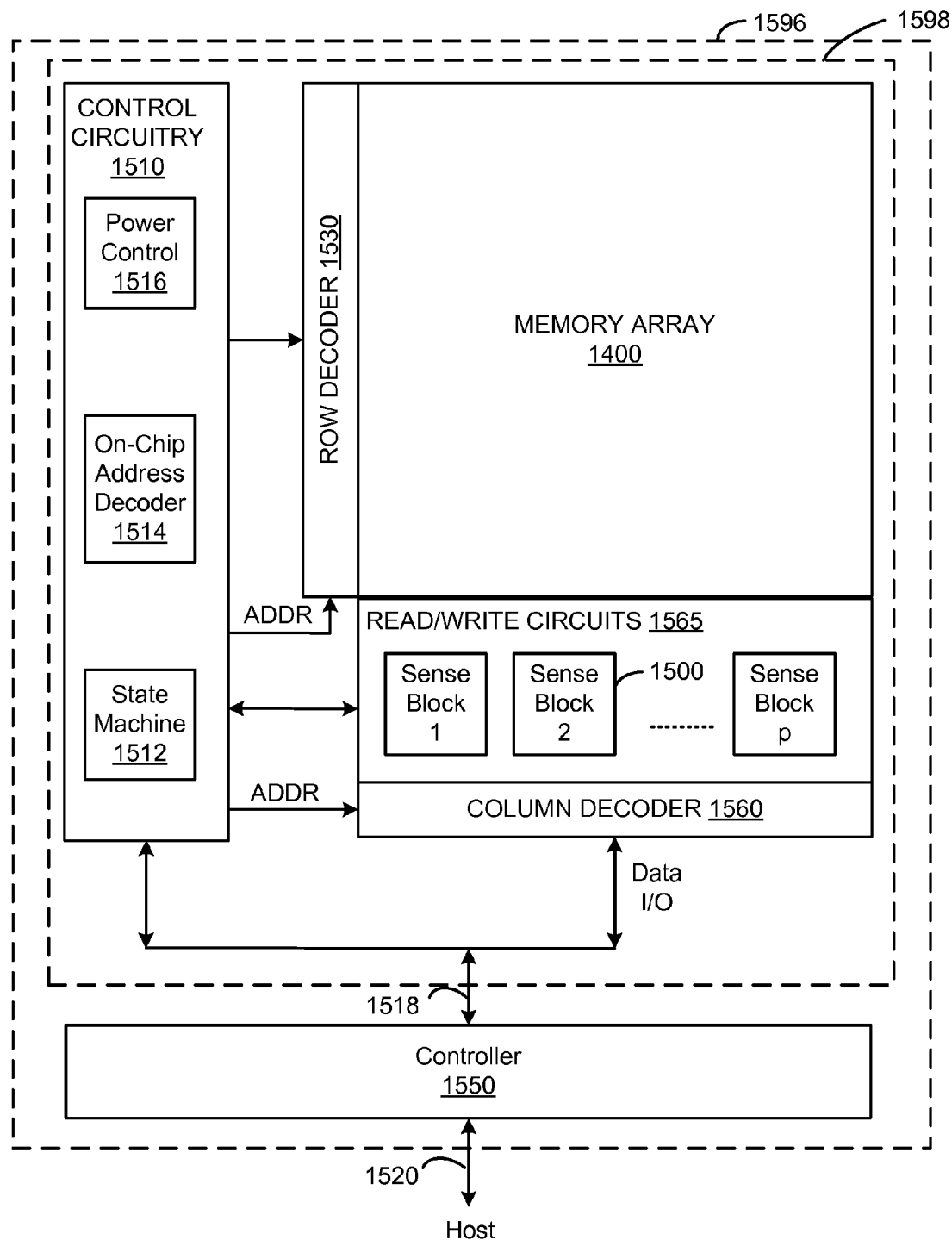
FIG. 15 is a block diagram of a non-volatile memory system using single row/column decoders and read/write circuits.

FIG. 15 is a block diagram of a non-volatile memory system using single row/column decoders and read/write circuits. The diagram illustrates a memory device 1596 having read/write circuits for reading and programming a page of storage elements in parallel, according to one embodiment of the present invention. Memory device 1596 may include one or more memory die 1598. Memory die 1598 includes a two-dimensional array of storage elements 1400, control circuitry 1510, and read/write circuits 1565. In some embodiments, the array of storage elements can be three dimensional. The memory array 1400 is addressable by word lines via a row decoder 1530 and by bit lines via a column decoder 1560. The read/write circuits 1565 include multiple sense blocks 1500 and allow a page of storage elements to be read or programmed in parallel. Typically a controller 1550 is included in the same memory device 1596 (e.g., a removable storage card) as the one or more memory die 1598. Commands and Data are transferred between the host and controller 1550 via lines 1520 and between the controller and the one or more memory die 1598 via lines 1518.

The control circuitry 1510 cooperates with the read/write circuits 1565 to perform memory operations on the memory array 1400. The control circuitry 1510 includes a state machine 1512, an on-chip address decoder 1514 and a power control module 1516. The state machine 1512 provides chip-level control of memory operations. The on-chip address decoder 1514 provides an address interface between that used by the host or a memory controller to the hardware address used by the decoders 1530 and 1560. The power control module 1516 controls the power and voltages supplied to the word lines and bit lines during memory operations.

In some implementations, some of the components of FIG. 15 can be combined. In various designs, one or more of the components (alone or in combination), other than storage element array 1400, can be thought of as a managing circuit. For example, one or more managing circuits may include any one of or a combination of control circuitry 1510, state machine 1512, decoders 1514/1560, power control 1516, sense blocks 1500, read/write circuits 1565, controller 1550, etc.

Figure 16:
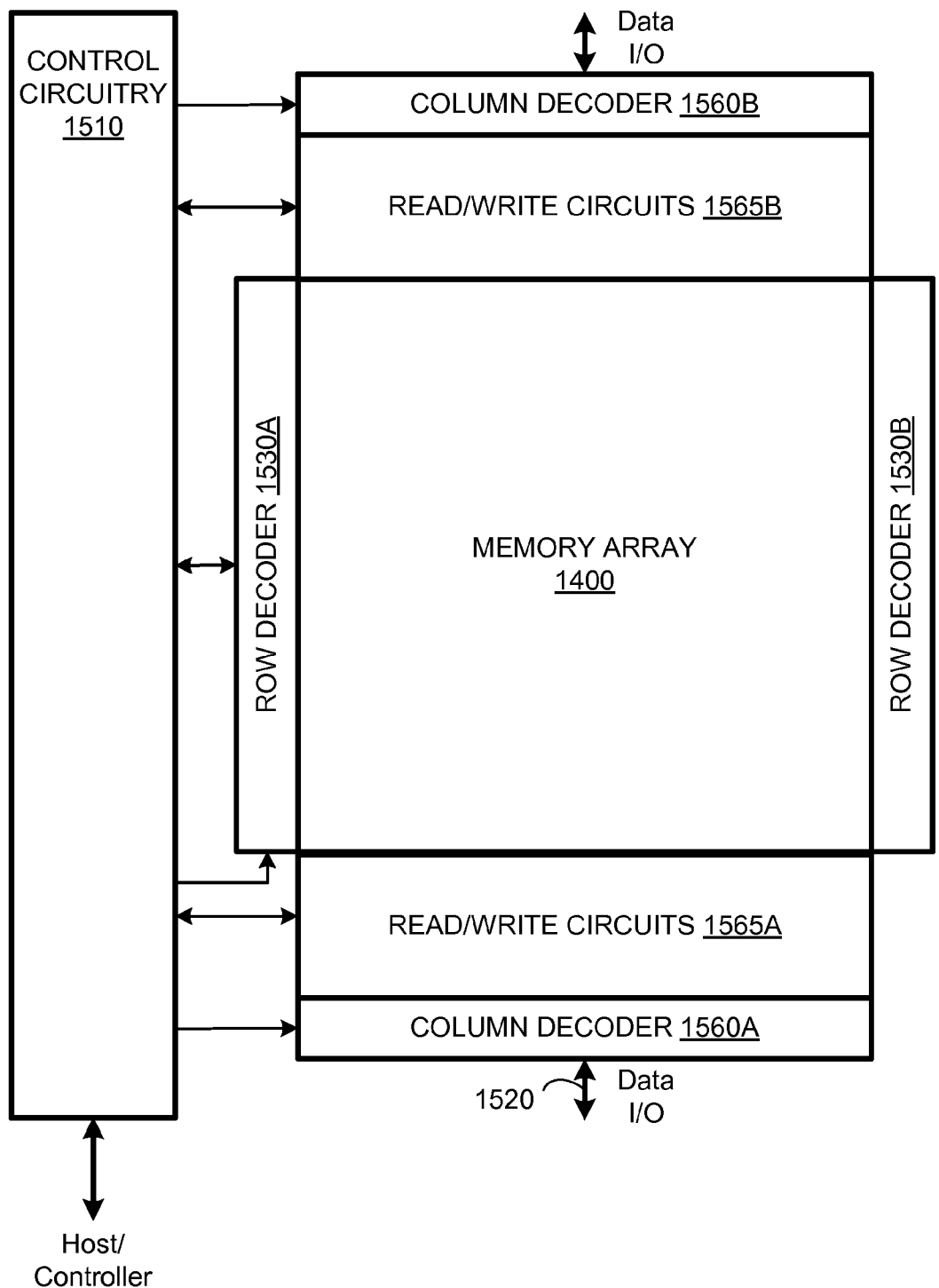
FIG. 16 is a block diagram of a non-volatile memory system using dual row/column decoders and read/write circuits.

FIG. 16 is a block diagram of a non-volatile memory system using dual row/column decoders and read/write circuits. Here, another arrangement of the memory device 1596 shown in FIG. 15 is provided. Access to the memory array 1400 by the various peripheral circuits is implemented in a symmetric fashion, on opposite sides of the array, so that the densities of access lines and circuitry on each side are reduced by half. Thus, the row decoder is split into row decoders 1530A and 1530B and the column decoder into column decoders 1560A and 1560B. Similarly, the read/write circuits are split into read/write circuits 1565A connecting to bit lines from the bottom and read/write circuits 1565B connecting to bit lines from the top of the array 1400. In this way, the density of the read/write modules is essentially reduced by one half. The device of FIG. 16 can also include a controller, as described above for the device of FIG. 15.

Figure 17:
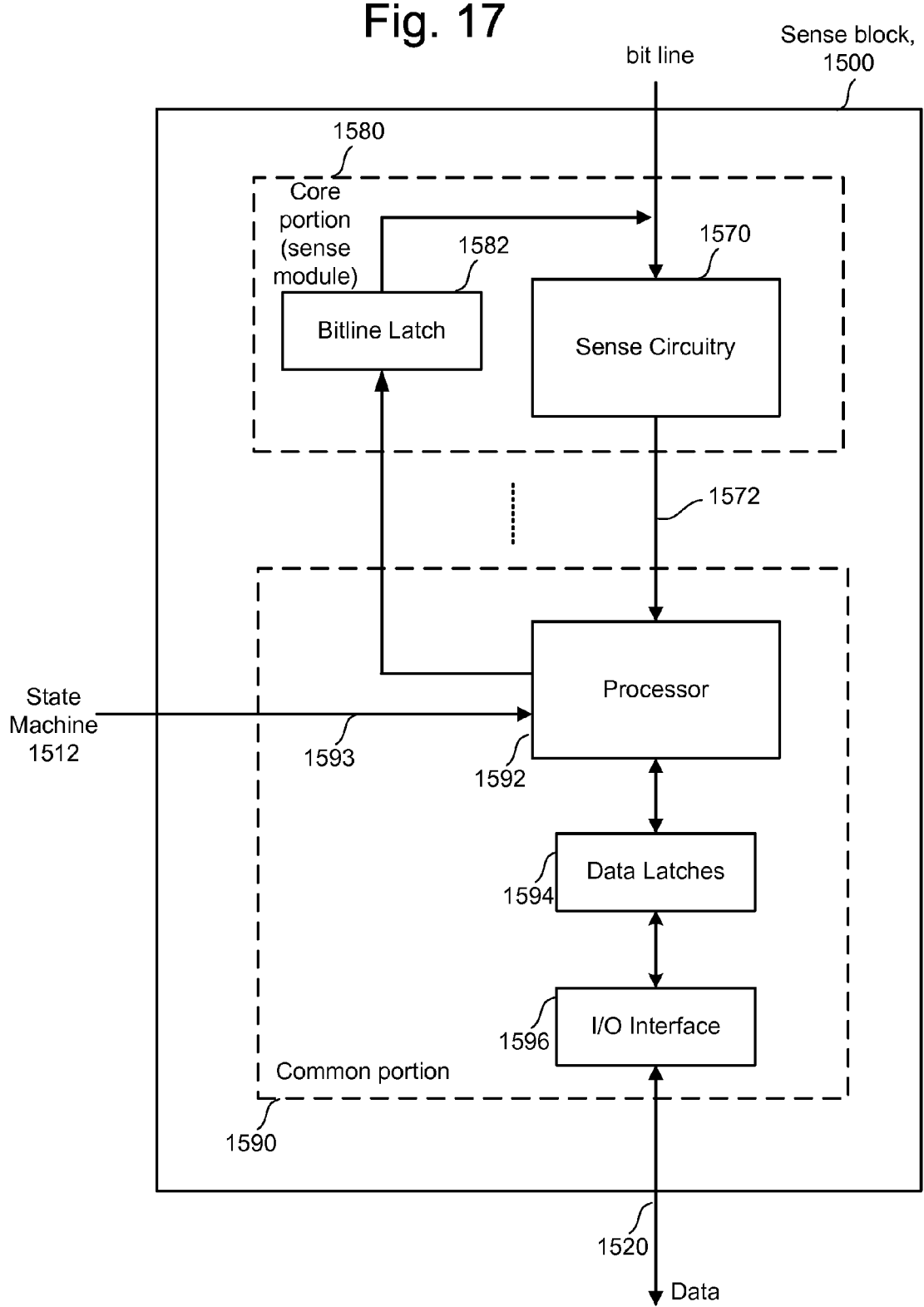
FIG. 17 is a block diagram depicting one embodiment of a sense block.

FIG. 17 is a block diagram depicting one embodiment of a sense block. An individual sense block 1500 is partitioned into a core portion, referred to as a sense module 1580, and a common portion 1590. In one embodiment, there will be a separate sense module 1580 for each bit line and one common portion 1590 for a set of multiple sense modules 1580. In one example, a sense block will include one common portion 1590 and eight sense modules 1580. Each of the sense modules in a group will communicate with the associated common portion via a data bus 1572. For further details refer to U.S. Patent Application Pub No. 2006/0140007, titled "Non-Volatile Memory & Method with Shared Processing for an Aggregate of Sense Amplifiers" published Jun. 29, 2006, and incorporated herein by reference in its entirety.

Sense module 1580 comprises sense circuitry 1570 that determines whether a conduction current in a connected bit line is above or below a predetermined threshold level. Sense module 1580 also includes a bit line latch 1582 that is used to set a voltage condition on the connected bit line. For example, a predetermined state latched in bit line latch 1582 will result in the connected bit line being pulled to a state designating program inhibit (e.g., Vdd).

Common portion 1590 comprises a processor 1592, a set of data latches 1594 and an I/O Interface 1596 coupled between the set of data latches 1594 and data bus 1520. Processor 1592 performs computations. For example, one of its functions is to determine the data stored in the sensed storage element and store the determined data in the set of data latches. The set of data latches 1594 is used to store data bits determined by processor 1592 during a read operation. It is also used to store data bits imported from the data bus 1520 during a program operation. The imported data bits represent write data meant to be programmed into the memory. I/O interface 1596 provides an interface between data latches 1594 and the data bus 1520.

During read or sensing, the operation of the system is under the control of state machine 1512 that controls the supply of different control gate voltages to the addressed storage element. As it steps through the various predefined control gate voltages corresponding to the various memory states supported by the memory, the sense module 1580 may trip at one of these voltages and an output will be provided from sense module 1580 to processor 1592 via bus 1572. At that point, processor 1592 determines the resultant memory state by consideration of the tripping event(s) of the sense module and the information about the applied control gate voltage from the state machine via input lines 1593. It then computes a binary encoding for the memory state and stores the resultant data bits into data latches 1594. In another embodiment of the core portion, bit line latch 1582 serves double duty, both as a latch for latching the output of the sense module 1580 and also as a bit line latch as described above.

It is anticipated that some implementations will include multiple processors 1592. In one embodiment, each processor 1592 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1592 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1594 from the data bus 1520. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1592 monitors the read back memory state relative to the desired memory state. When the two are in agreement, the processor 1592 sets the bit line latch 1582 so as to cause the bit line to be pulled to a state designating program inhibit. This inhibits the storage element coupled to the bit line from further programming even if programming pulses appear on its control gate. In other embodiments the processor initially loads the bit line latch 1582 and the sense circuitry sets it to an inhibit value during the verify process.

Data latch stack 1594 contains a stack of data latches corresponding to the sense module. In one embodiment, there are three data latches per sense module 1580. In some implementations (but not required), the data latches are implemented as a shift register so that the parallel data stored therein is converted to serial data for data bus 1520, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015, 199 titled "Improved Memory Sensing Circuit And Method For Low Voltage Operation," filed on Dec. 16, 2004 (issued as U.S. Pat. No. 7,046,568 on May 16, 2006); (4) U.S. patent application Ser. No. 11/099,133, titled "Compensating for Coupling During Read Operations of Non-Volatile Memory," filed on Apr. 5, 2005 (issued as U.S. Pat.No. 7,196,928 on Mar. 27, 2007); and (5) U.S. patent application Ser. No. 11/321,953, titled "Reference Sense Amplifier For Non-Volatile Memory," filed on Dec. 28, 2005 (published as US pub. 2006/0158947 on Jul. 20, 2006). All five of the immediately above-listed patent documents are incorporated herein by reference in their entirety.

Figure 18:
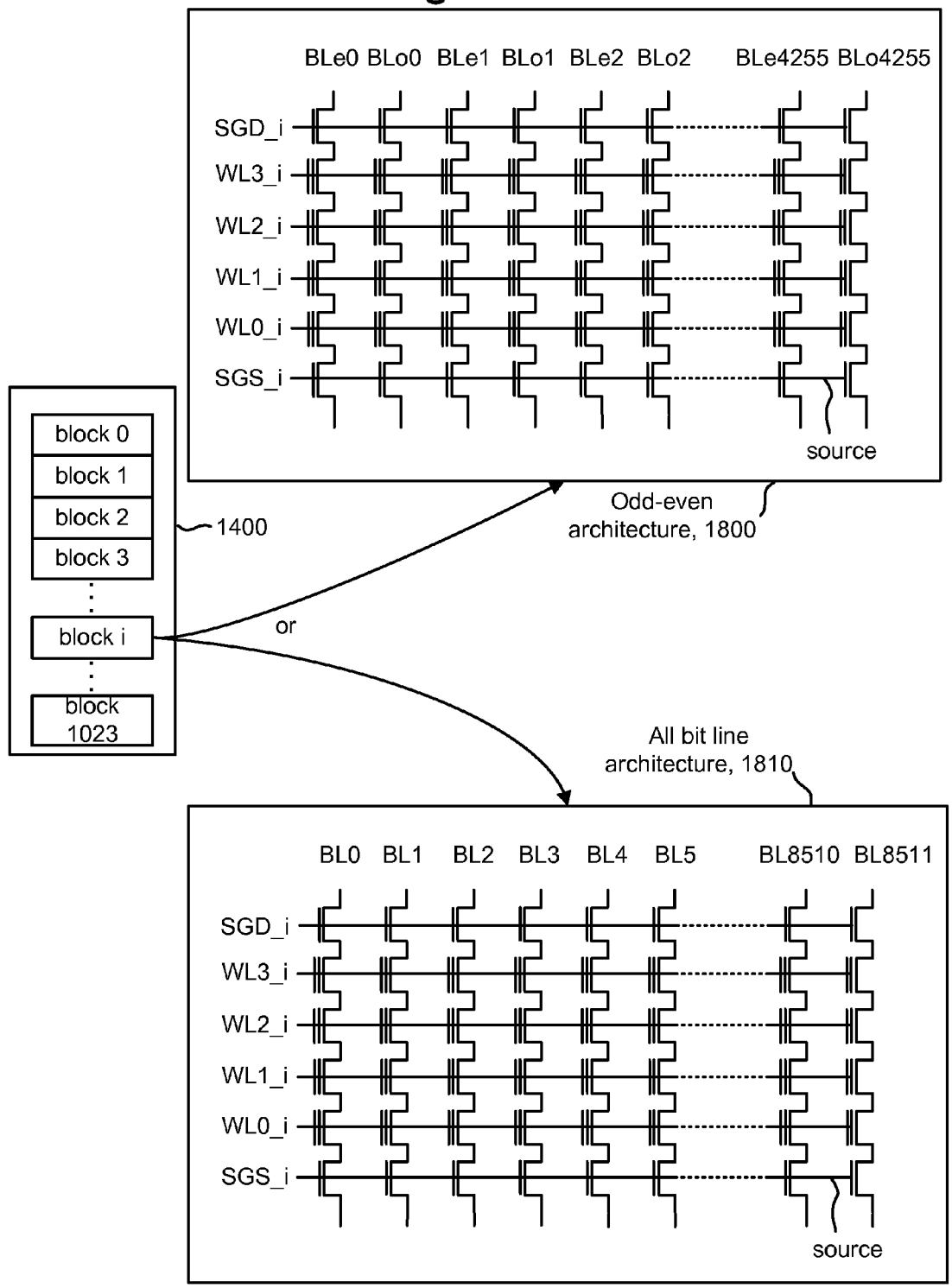
FIG. 18 illustrates an example of an organization of a memory array into blocks for an all bit line memory architecture or for an odd-even memory architecture.

FIG. 18 illustrates an example of an organization of a memory array into blocks for an all bit line memory architecture or for an odd-even memory architecture. Exemplary structures of storage element array 1400 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, ... BL8511. In one embodiment referred to as an all bit line (ABL) architecture (architecture 1810), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1800), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{PASS}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 19:
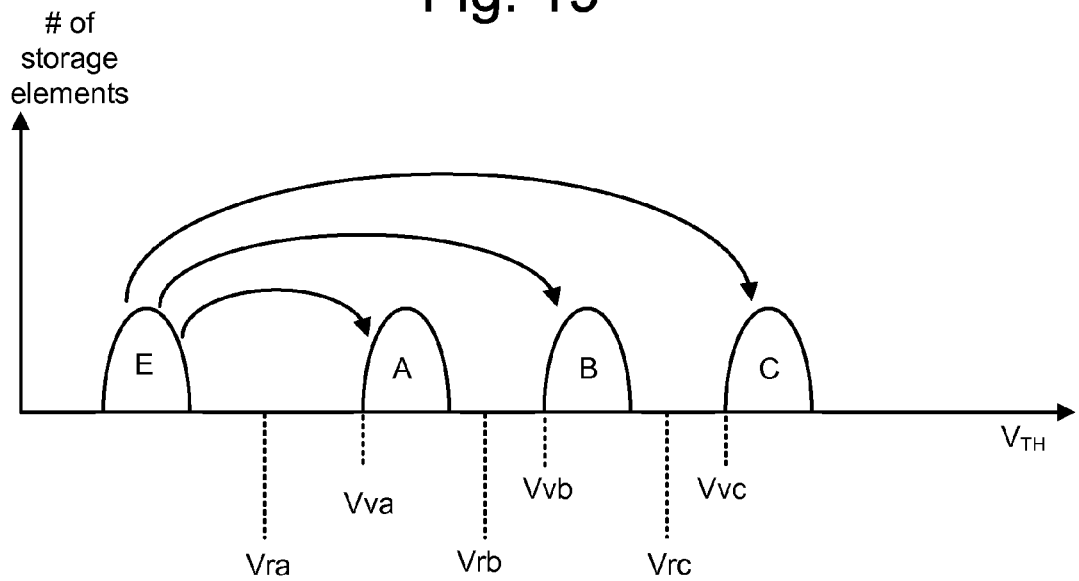
FIG. 19 depicts an example set of threshold voltage distributions.

FIG. 19 depicts an example set of threshold voltage distributions. Example threshold voltage distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine what state the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 23 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 20:
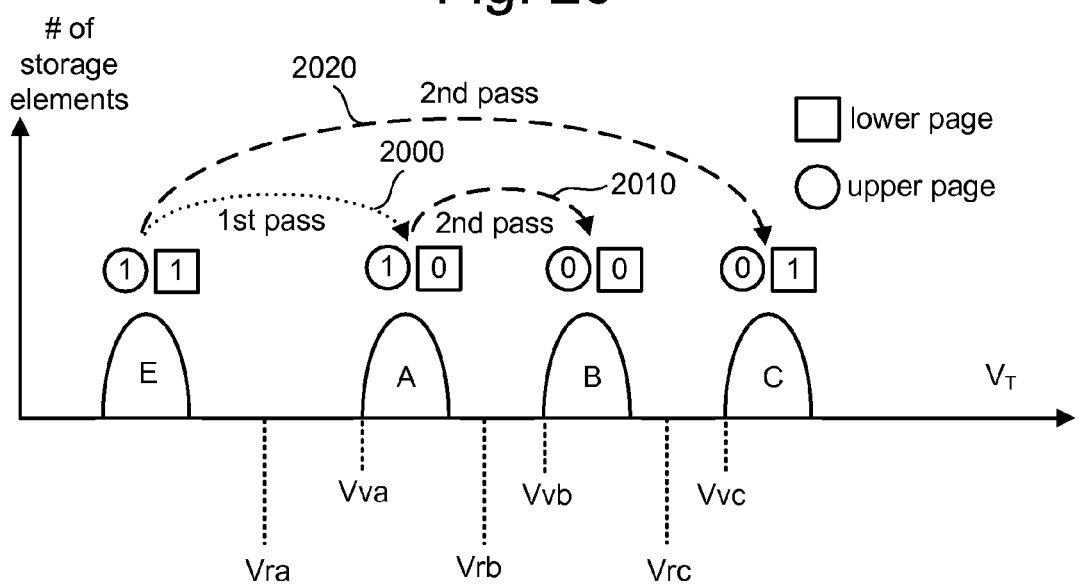
FIG. 20 depicts an example set of threshold voltage distributions.

FIG. 20 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 1100. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2020. If the storage element had been programmed into state A as a result of the first programming pass, then the storage element is further programmed in the second pass so that the threshold voltage is increased to be within state B, as depicted by arrow 2010. The result of the second pass is to program the storage element into the state designated to store a logic "0" for the upper page without changing the data for the lower page. In both FIG. 19 and FIG. 20 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

FIGS. 21A-C disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 21A therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 1250 of FIG. 21B. This apparent widening of the threshold voltage distribution will be remedied when programming the upper page.

FIG. 21C depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2150 and the upper page data is to remain at 1, then the storage element will be programmed to final state B. If the storage element is in intermediate threshold voltage distribution 2150 and the upper page data is to become data 0, then the threshold voltage of the storage element will be raised so that the storage element is in state C. The process depicted by FIGS. 21A-C reduces the effect of floating gate to floating gate coupling because only the upper page programming of neighbor storage elements will have an effect on the apparent threshold voltage of a given storage element. An example of an alternate state coding is to move from distribution 2150 to state C when the upper page data is a 1, and to move to state B when the upper page data is a 0.

Although FIGS. 21A-C provide an example with respect to four data states and two pages of data, the concepts taught can be applied to other implementations with more or fewer than four states and different than two pages.

Figure 22:
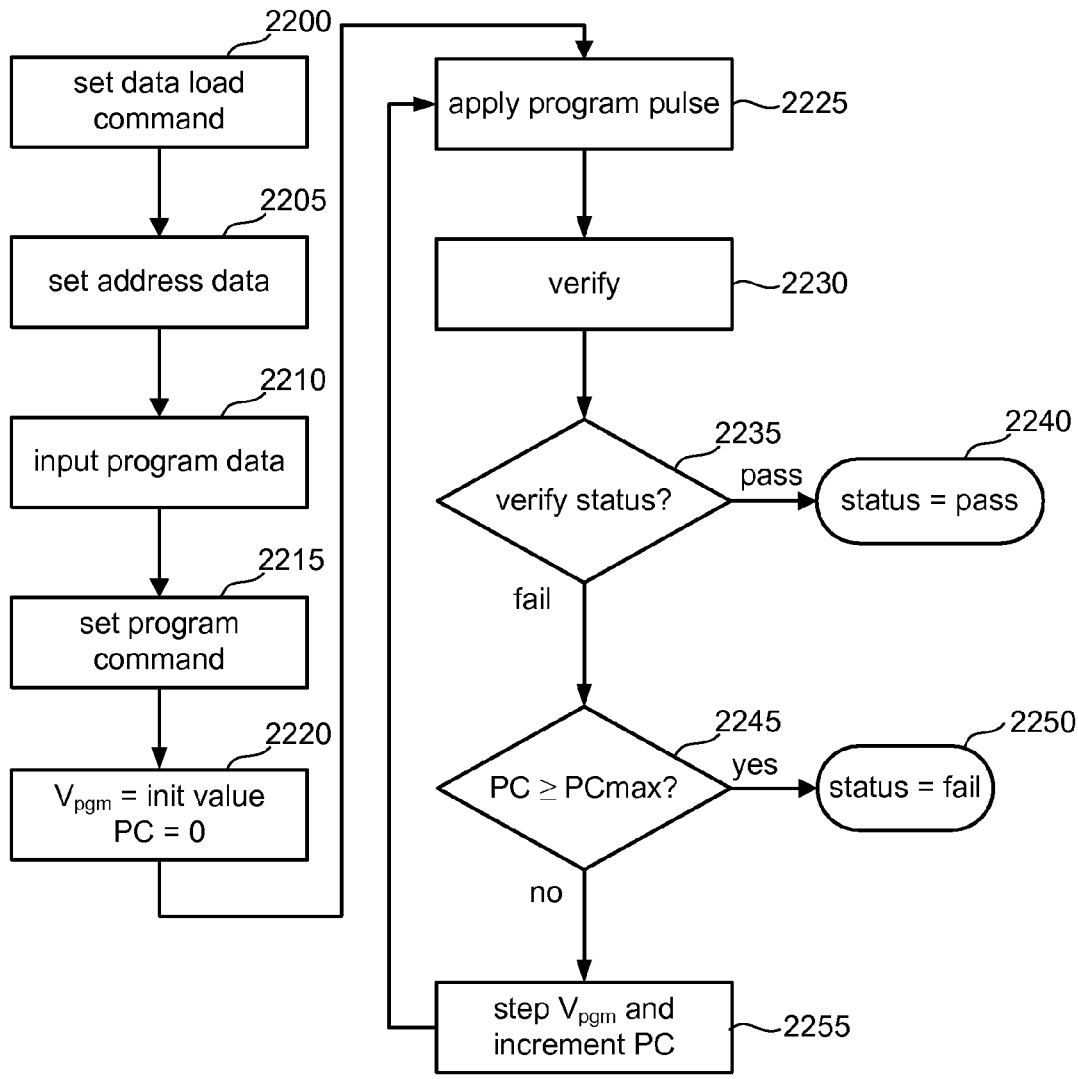
FIG. 22 is a flow chart describing one embodiment of a process for programming non-volatile memory.

FIG. 22 is a flow chart describing one embodiment of a method for programming non-volatile memory. In one implementation, storage elements are erased (in blocks or other units) prior to programming. In step 2200, a "data load" command is issued by the controller and input received by control circuitry 1510. In step 2205, address data designating the page address is input to decoder 1514 from the controller or host. In step 2210, a page of program data for the addressed page is input to a data buffer for programming. That data is latched in the appropriate set of latches. In step 2215, a "program" command is issued by the controller to state machine 1512.

Figure 23:
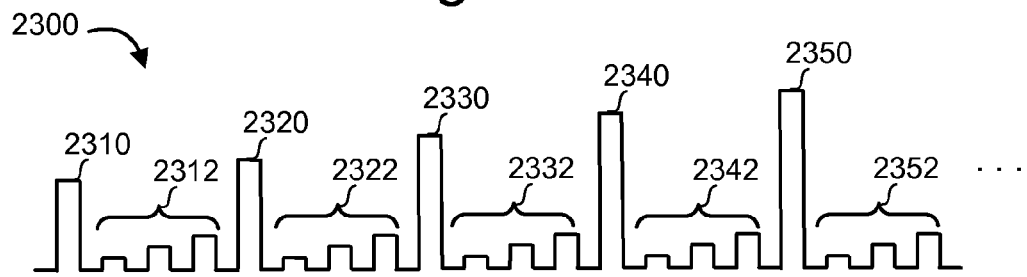
FIG. 23 is an example waveform applied to the control gates of non-volatile storage elements during programming.

Triggered by the "program" command, the data latched in step 2210 will be programmed into the selected storage elements controlled by state machine 1512 using the stepped pulses 2310, 2320, 2330, 2340, 2350, . . . of FIG. 23 applied to the appropriate word line. In step 2220, the program voltage, $V_{PGM}$, is initialized to the starting pulse (e.g., 12 V or other value) and a program counter PC maintained by state machine 1512 is initialized at 0. In step 2225, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming.

In step 2230, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 2235, it is checked whether all of the data latches are storing logic "1." If so, the programming process is complete and successful because all selected storage elements were programmed and verified. A status of "PASS" is reported in step 2240.

If, in step 2235, it is determined that not all of the data latches are storing logic "1," then the programming process continues. In step 2245, the program counter PC is checked against a program limit value PCmax. One example of a program limit value is twenty; however, other numbers can also be used. If the program counter PC is not less than PCmax, then the program process has failed and a status of "FAIL" is reported in step 2250. If the program counter PC is less than PCmax, then $V_{PGM}$ is increased by the step size and the program counter PC is incremented in step 2255. After step 2255, the process loops back to step 2225 to apply the next $V_{PGM}$ pulse.

FIG. 23 shows a voltage waveform 2300 which includes a series of program pulses 2310, 2320, 2330, 2340, 2350, . . . , that are applied to a word line selected for programming. In one embodiment, the programming pulses have a voltage, $V_{PGM}$, which starts at 12 V and increases by increments, e.g., 0.5 V, for each successive programming pulses until a maximum of 21 V is reached. In between the program pulses are sets of verify pulses 2312, 2322, 2332, 2342, 2352, . . . . In some embodiments, there can be a verify pulse for each state that data is being programmed into. In other embodiments, there can be more or fewer verify pulses. The verify pulses in each set can have amplitudes of Vva, Vvb and Vvc (FIG. 20), for instance.

In one embodiment, data is programmed to storage elements along a common word line. Thus, prior to applying the program pulses, one of the word lines is selected for programming. This word line is referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 3 is the selected word line, then WL1 is the source side neighboring word line and WL3 is the drain side neighboring word line.

Each block of storage elements includes a set of bit lines forming columns and a set of word lines forming rows. In one embodiment, the bit lines are divided into odd bit lines and even bit lines. As discussed in connection with FIG. 18, storage elements along a common word line and connected to the odd bit lines are programmed at one time, while storage elements along a common word line and connected to even bit lines are programmed at another time ("odd/even programming"). In another embodiment, storage elements are programmed along a word line for all bit lines in the block ("all bit line programming"). In other embodiments, the bit lines or block can be broken up into other groupings (e.g., left and right, more than two groupings, etc.)

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for reducing program disturb in a non-volatile storage system, comprising:
    implanting a shallow implantation of ions along a length of an area of a substrate;
    implanting a deep implantation of ions in a first interval along the length of the area of the substrate but not in a second interval along the length of the area of the substrate, the deep implantation of ions is implanted deeper in the substrate than the shallow implantation of ions; and
    forming a NAND string along the length of the area of the substrate, where the shallow implantation of ions extends along a length of the NAND string, from one end of the NAND string to another end of the NAND string, in a bit line direction of the NAND string, a first portion of the NAND string is formed directly over the first interval but not the second interval, a second portion of the NAND string is formed directly over the second interval but not the first interval, the first portion of the NAND string is adjacent to the second portion of the NAND string in the bit line direction, and the first interval is adjacent to the second interval in the bit line direction.

2. The method of claim 1, wherein:
    a select gate of the NAND string is formed directly over the first interval.

3. The method of claim 1, wherein:
    a plurality of word lines extend across the NAND string, a first subset of multiple word lines of the plurality of word lines is located directly over the first interval but not the second interval; and
    a second subset of multiple word lines of the plurality of word lines which is adjacent to the first subset of multiple word lines of the plurality of word lines, is located directly over the second interval but not the first interval.

4. The method of claim 3, wherein:
    a select gate of the NAND string is formed directly over the first interval; and
    the first subset of multiple word lines of the plurality of word lines is adjacent to the select gate of the NAND string.

5. The method of claim 1, further comprising:
    implanting a deep implantation of ions in a third interval along the length of the area of the substrate, the deep implantation of ions in third interval is implanted deeper in the substrate than the shallow implantation of ions, and a third portion of the NAND string, adjacent to the second portion of the NAND string, is formed directly over the third interval.

6. The method of claim 5, wherein:
    the first and third intervals are separated by the second interval, along the length of the NAND string;
    a first select gate of the NAND string is adjacent to the first portion of the NAND string and is formed directly over the first interval;
    a second select gate of the NAND string is adjacent to the third portion of the NAND string and is formed directly over the third interval; and
    the first and second select gates are at opposing ends of the NAND string.

7. The method of claim 1, wherein:
    the NAND string is formed end to end with an additional NAND string along the length of the area of the substrate; and
    the first interval extends directly under associated select gates at the ends of the NAND strings.

8. The method of claim 1, further comprising:
    the NAND string comprises a set of series-connected non-volatile storage elements;
    all of the non-volatile storage elements in the NAND string are located directly over the shallow implantation of ions;
    a first subset of multiple non-volatile storage elements in the NAND string is located directly over the first interval but not the second interval; and
    a second subset of multiple non-volatile storage elements in the NAND string which is adjacent to the first subset of multiple non-volatile storage elements, is located directly over the second interval but not the first interval.

9. The method of claim 1, wherein the NAND string comprises a set of series-connected non-volatile storage elements, the method further comprising:
    forming source/drain regions in the substrate for each series-connected non-volatile storage element, after the implanting the shallow implantation of ions and the implanting the deep implantation of ions.

10. A method for reducing program disturb in a non-volatile storage system, comprising:
    implanting a locally elevated level of ions in a first portion of a substrate but not in an adjacent second portion of the substrate; and
    forming a NAND string, at least in part, over the substrate, the NAND string comprises a set of series-connected non-volatile storage elements, source/drain regions formed in the substrate for each series-connected non-volatile storage element, and first and second select gates at opposing ends of the NAND string, the NAND string is in communication with a plurality of word lines including a first subset of multiple word lines of the plurality of word lines which extends directly over the first portion of the substrate but does not extend directly over the second portion of the substrate, and a second subset of multiple word lines of the plurality of word lines which is adjacent to the first subset of multiple word lines of the plurality of word lines, and which extends directly over the second portion of the substrate but does not extend directly over the first portion of the substrate.

11. The method of claim 10, wherein:
    the first select gate is at a source side of the NAND string and extends directly over the first portion of the substrate.

12. The method of claim 10, wherein:
    the first select gate is at a drain side of the NAND string and extends directly over the first portion of the substrate.

13. The method of claim 10, wherein:

the locally elevated level of implanted ions increases a channel capacitance of the first portion of the substrate relative to a channel capacitance of the second portion of the substrate.

14. The method of claim 10, further comprising:

implanting a locally elevated level of ions in a third portion of the substrate which is adjacent to the second portion of the substrate, where a third subset of multiple word lines of the plurality of word lines which is adjacent to the second subset of multiple word lines of the plurality of word lines, extends directly over the third portion of the substrate but does not extend directly over the first and second portions of the substrate.

15. The method of claim 14, wherein:

the locally elevated level of implanted ions in the third portion of the substrate increases a channel capacitance of the third second portion of the substrate relative to the second portion of the substrate.

16. The method of claim 14, wherein:

the first subset of multiple word lines of the plurality of word lines is adjacent to the first select gate; and the third subset of multiple word lines of the plurality of word lines is adjacent to the second select gate.

17. The method of claim 16, wherein:

the first select gate is at a source side of the NAND string and the second select gate is at a drain side of the NAND string.

18. The method of claim 10, wherein:

the implanted ions comprise at least one of Boron ions and Indium ions.

19. The method of claim 10, wherein:

the NAND string comprises a plurality of non-volatile storage elements; and an additional implantation of ions is provided in the substrate including the first and second portions of the substrate, the additional implantation of ions extending at least from one end of the NAND string to another end of the NAND string, for controlling a threshold voltage of each of the plurality of non-volatile storage elements, the ions which provide the locally elevated level of implanted ions are implanted deeper in the substrate than the additional implantation of ions.

20. The method of claim 10, wherein:

the ions are implanted to a depth in the substrate based on a compromise between: (a) increasing a channel capacitance of the first portion of the substrate and avoiding affecting a threshold voltage of one or more non-volatile storage elements of the NAND string which are over the first portion.

* * * * *